United States Patent
Uetmatsu

(10) Patent No.: US 8,542,003 B2
(45) Date of Patent: Sep. 24, 2013

(54) TEST APPARATUS TO TEST A DATA SIGNAL AND A CLOCK SIGNAL OUTPUT FROM A DEVICE UNDER TEST

(75) Inventor: Tomohiro Uetmatsu, Tokyo (JP)

(73) Assignee: Advantest Corporation, Tokyo (JP)

( * ) Notice: Subject to any disclaimer, the term of this patent is extended or adjusted under 35 U.S.C. 154(b) by 322 days.

(21) Appl. No.: 13/055,982

(22) PCT Filed: Jul. 29, 2009

(86) PCT No.: PCT/JP2009/003590
§ 371 (c)(1),
(2), (4) Date: Jan. 26, 2011

(87) PCT Pub. No.: WO2010/013464
PCT Pub. Date: Feb. 4, 2010

(65) Prior Publication Data
US 2011/0121814 A1    May 26, 2011

(30) Foreign Application Priority Data
Aug. 1, 2008   (JP) .................................. 2008-199987

(51) Int. Cl.
G01R 23/175    (2006.01)
H01H 47/18     (2006.01)
H03L 7/00      (2006.01)
H03H 11/26     (2006.01)

(52) U.S. Cl.
USPC .................... 324/76.11; 324/76.35; 361/196; 327/161; 327/271

(58) Field of Classification Search
USPC ................ 324/76.11, 76.23–76.54; 714/724; 361/196; 327/271, 161
See application file for complete search history.

(56) References Cited

U.S. PATENT DOCUMENTS

| 7,263,646 B2 * | 8/2007 | Glenn et al. ................... 714/758 |
| 2006/0170472 A1 * | 8/2006 | Suda et al. ..................... 327/158 |
| 2007/0083801 A1 * | 4/2007 | Kanbayashi ................... 714/724 |
| 2007/0282555 A1 | 12/2007 | Chong et al. ................... 702/107 |

FOREIGN PATENT DOCUMENTS

| EP | 1653650 A1 | 5/2006 |
| JP | 4002811 | 4/2004 |
| JP | 2005-285160 | 10/2005 |
| JP | 2007-48386 A | 2/2007 |

(Continued)

OTHER PUBLICATIONS

PCT International Search Report and Written Opinion issued in PCT Application No. PCT/JP2009/003590 and mailed on Nov. 2, 2009, with English-language translations.

(Continued)

Primary Examiner — Melissa Koval
Assistant Examiner — Farhana Hoque
(74) Attorney, Agent, or Firm — Ladas & Parry, LLP

(57) ABSTRACT

A first timing comparator TCP1 latches a data signal at a timing that corresponds to each edge of a first strobe signal. A first delay element delays a first strobe signal so as to output a first delayed strobe signal. A first clock recovery unit makes a comparison between the phase of the first delayed strobe signal and a clock signal, and outputs a first reference strobe signal which is used to perform phase adjustment such that the phases of these signals match each other. A third delay element delays a first reference strobe signal, and outputs the signal thus delayed as the first strobe signal. A delay amount that corresponds to the amount of skew that occurs between the data signal and the clock signal is set for the third delay element.

4 Claims, 4 Drawing Sheets

(56) References Cited

FOREIGN PATENT DOCUMENTS

| JP | 2009-68949 A | 4/2009 |
| WO | 2007/043480 A1 | 4/2007 |
| WO | 2007/129386 A1 | 11/2007 |

OTHER PUBLICATIONS

PCT International Preliminary Report on Patentability issued in PCT/JP2009/003590 and mailed on Feb. 10, 2011.

* cited by examiner

TEST APPARATUS TO TEST A DATA SIGNAL AND A CLOCK SIGNAL OUTPUT FROM A DEVICE UNDER TEST

CROSS REFERENCE TO RELATED APPLICATIONS

This application is the U.S. National Stage of International Patent Application No. PCT/JP2009/003590 filed on Jul. 29, 2009 which claims priority to Japanese Patent Application No. 2008-199987 filed on Aug. 1, 2008, the disclosures of which are hereby incorporated by reference in their entirety.

BACKGROUND OF THE INVENTION

1. Field of the Invention

The present invention relates to a test apparatus configured to test a device employing a source synchronous method.

2. Description of the Related Art

Devices such as SDRAM (Synchronous Dynamic Random Access Memory) employ the source synchronous method so as to perform data transmission with another device. With the source synchronous method, a transmission device outputs a source synchronous clock signal SSCLK (which is also referred to as a "data strobe signal DQS", and which will be referred to as simply the "clock signal SSCLK" hereafter) together with a data signal DQ. A reception device acquires the value of the data signal DQ at a timing that corresponds to each edge of the source synchronous clock SSCLK. Such a method provides stable data transmission even if a high-speed operation clock is employed.

RELATED ART DOCUMENTS

Japanese Patent Application No. 4002811
Japanese Patent Application Laid Open No. 2005-285160

In the source synchronous method, the timing relation between the source synchronous clock SSCLK and the data signal DQ is very important. A test apparatus configured to test a device employing the source synchronous method has a function of generating a strobe signal which is in synchronization with the source synchronous clock SSCLK, and a function of acquiring the value of the data signal DQ at a timing that corresponds to each edge of the strobe signal. Furthermore, the test apparatus has a function of measuring the timing of each transition point of the source synchronous clock SSCLK and the timing of each transition point of the data signal DQ. Typical test apparatuses execute such test operations assuming that there is no phase difference between the data signal DQ and the source synchronous clock SSCLK at the output terminal (which will be referred to as the "DUT terminal") of the device under test (which will be referred to as the "DUT" hereafter). Accordingly, in a case in which such a phase difference exists, the phase difference functions as skew, leading to a difference between the timing of the source synchronous clock SSCLK and the timing at which the data signal DQ is acquired.

In order to solve such a problem, a technique has been proposed in which a multi-strobe signal is generated, and the values of the clock signal and the data signal are evaluated at timings that correspond to multiple edges of the multi-strobe signal thus generated (see Patent document 1).

However, such an arrangement employing such a multi-strobe signal leads to a problem of an increased circuit scale. Thus, in a case in which there are cost or size constraints, there is a need to solve the aforementioned problem using other methods.

SUMMARY OF THE INVENTION

The present invention has been made in view of such a situation. Accordingly, it is an exemplary purpose of the present invention to provide a test apparatus which is capable of performing a test operation that takes into account skew that occurs between the clock signal and the data signal at the device terminal.

An embodiment of the present invention relates to a test apparatus configured to test a data signal and a clock signal output from a device under test using a source synchronous method. The test apparatus comprises: a first timing comparator configured to latch the data signal at a timing that corresponds to each edge of a first strobe signal; a first delay element configured to delay the first strobe signal so as to output a first delayed strobe signal; a first clock recovery unit configured to make a comparison between the phase of the first delayed strobe signal and the phase of the clock signal, and to output a first reference strobe signal so as to perform phase adjustment such that the phases thus compared match each other; a third delay element configured to delay the first reference strobe signal, and to output the signal thus delayed as the first strobe signal; a second timing comparator configured to latch the clock signal at a timing that corresponds to each edge of the second strobe signal; a second delay element configured to delay the second strobe signal so as to output a second delayed strobe signal; a second clock recovery unit configured to make a comparison between the phase of the second delayed strobe signal and the phase of the clock signal, and to output a second reference strobe signal so as to perform phase adjustment such that the phases thus compared match each other; and a fourth delay element configured to delay the second reference strobe signal, and to output the signal thus delayed as the second strobe signal.

With such an embodiment, by optimizing the delay amount to be applied by each of the first delay element through the fourth delay element, such an arrangement allows the internal circuit of the test apparatus to reproduce the phase relation between the data signals and the clock signal at the device terminal.

Also, the test apparatus according to an embodiment may further comprise a skew measurement unit configured to measure an amount of skew that occurs between the clock signal and the data signal. Also, the third and fourth delay elements may respectively delay the first and second reference strobe signals by the amount of skew thus measured.

Also, the delay amount to be applied by the first delay element may be set to a transmission time that is required to transmit the clock signal via a path from an output terminal of the device under test to an input terminal of the first clock recovery unit. Also, the delay amount to be applied by the second delay element may be set to a transmission time that is required to transmit the clock signal via a path from the output terminal of the device under test to an input terminal of the second clock recovery unit.

Such an arrangement allows the test apparatus to set the basis of timing to that at the output terminal of the device under test.

It is to be noted that any arbitrary combination or rearrangement of the above-described structural components and so forth is effective as and encompassed by the present embodiments.

Moreover, this summary of the invention does not necessarily describe all necessary features so that the invention may also be a sub-combination of these described features.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION OF THE INVENTION

Figure 1:
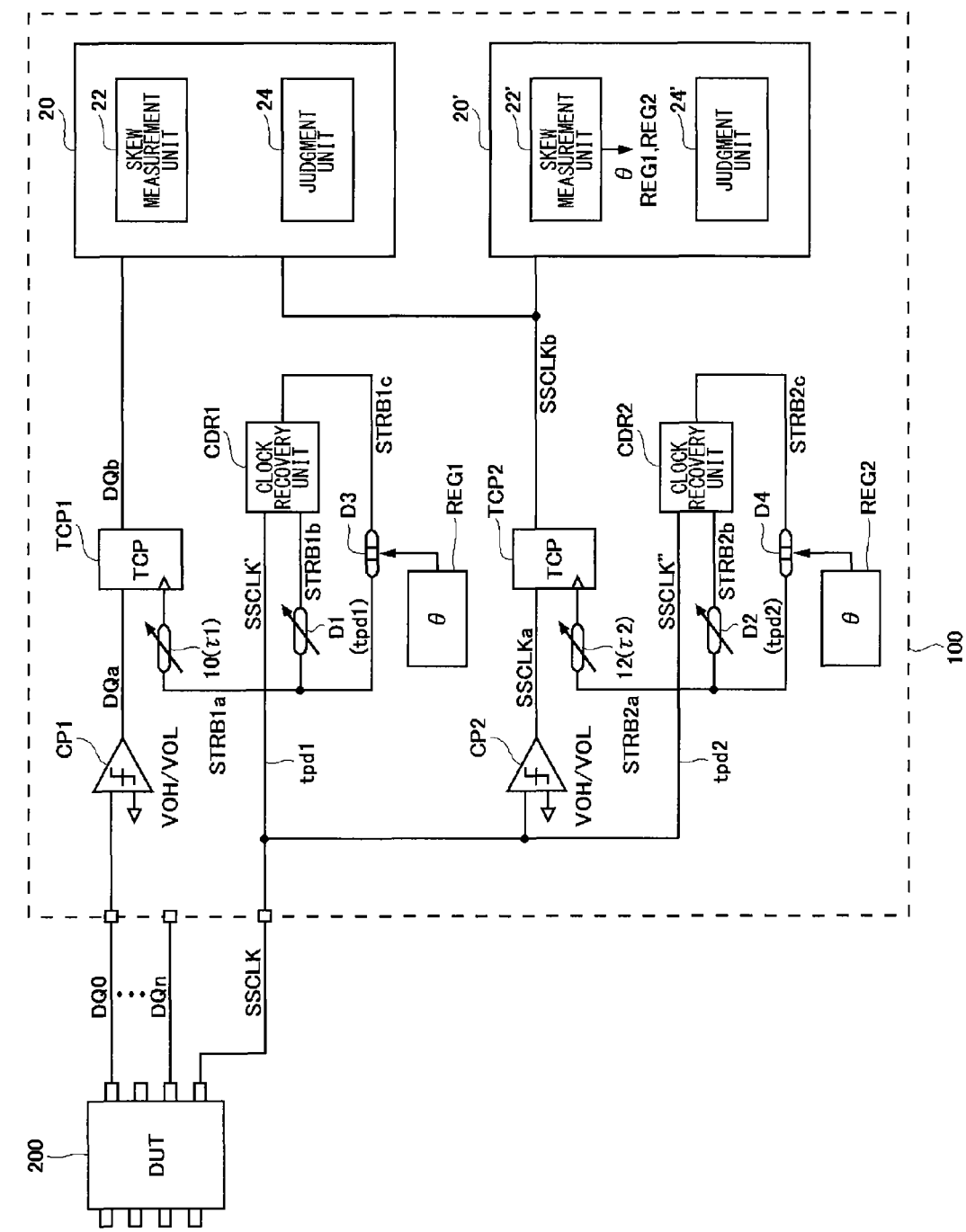
FIG. 1 is a block diagram which shows a configuration of a test apparatus according to an embodiment.

Description will be made below regarding preferred embodiments according to the present invention with reference to the drawings. The same or similar components, members, and processes are denoted by the same reference numerals, and redundant description thereof will be omitted as appropriate. The embodiments have been described for exemplary purposes only, and are by no means intended to restrict the present invention. Also, it is not necessarily essential for the present invention that all the features or a combination thereof be provided as described in the embodiments.

In the present specification, a state represented by the phrase "the member A is connected to the member B" includes a state in which the member A is indirectly connected to the member B via another member that does not affect the electric connection therebetween, in addition to a state in which the member A is physically and directly Pconnected to the member B. Similarly, a state represented by the phrase "the member C is provided between the member A and the member B" includes a state in which the member A is indirectly connected to the member C, or the member B is indirectly connected to the member C via another member that does not affect the electric connection therebetween, in addition to a state in which the member A is directly connected to the member C, or the member B is directly connected to the member C.

FIG. 1 is a block diagram which shows a configuration of a test apparatus 100 according to an embodiment. A DUT 200 is a device such as SDRAM, for example, configured to transmit data using the source synchronous method. The DUT 200 outputs multiple channels of data signals $DQ_0$ through $DQ_n$ (n represents an integer) and a clock signal SSCLK that is common to all the channels. The test apparatus 100 receives the data signal DQ and the source synchronous clock SSCLK, and generates a strobe signal STRB having a timing that corresponds to the source synchronous clock SSCLK. The test apparatus 100 latches the value of the data signal DQ at a timing of each edge of the strobe signal STRB. Furthermore, the test apparatus 100 compares the value of the data DQ thus latched with an expected value so as to judge the quality of the DUT 200, or so as to identify defective points.

Furthermore, the test apparatus 100 measures the timing of each transition point (edge) of the source synchronous clock SSCLK and the timing of each transition point of the data signal DQ, and judges whether or not these timings satisfy the standards, such as those for setup time, hold time, etc., thereby judging the quality of the DUT 200.

Specifically, the test apparatus 100 has the following configuration. The test apparatus 100 includes channels each having the same configuration. Only a single channel (0) is shown as a representative channel for simplicity of description and for ease of understanding.

The test apparatus 100 includes a first comparator CP1, a second comparator CP2, a first timing comparator TCP1, a second timing comparator TCP2, a first strobe adjustment unit 10, a second strobe adjustment unit 12, a first clock recovery unit CDR1, a second clock recovery unit CDR2, and signal processing units 20 and 20'.

The first comparator CP1 compares the data signal DQ1 with a threshold voltage VOH that corresponds to high level or a threshold voltage VOL that corresponds to low level, and outputs a judgment data signal DQa that corresponds to the level of the data signal DQ.

It should be noted that the first comparator CP1 may be configured as multiple comparators provided for the two threshold voltages VOH and VOL. In this case, the downstream circuit includes such two systems having the same configuration for the high level and low level.

The first timing comparator TCP1 latches the judgment data signal DQa at a timing that corresponds to each edge of a first strobe signal STRB1a. The first strobe adjustment unit 10 is configured as a variable delay circuit. The first strobe adjustment unit 10 applies a predetermined delay amount τ1 to the first strobe signal STRB1a, and outputs the first strobe signal STRB1a thus delayed to a clock terminal of the first timing comparator TCP1. The test apparatus 100 allows the first strobe adjustment unit 10 to set the delay amount τ1 to a selected desired value. Furthermore, the test apparatus 100 is capable of sweeping the delay amount τ1. By adjusting the delay amount τ1, such an arrangement is capable of setting the timing at which the judgment data signal DQa is to be acquired to a desired timing. The delay amount τ1 is normally set such that the timing at which the judgment data signal DQa is acquired is positioned in the vicinity of the midpoint between each positive edge and the corresponding negative edge of the judgment data signal DQa, taking into account the setup time and the hold time. By sweeping the delay amount τ1 in a predetermined range, such an arrangement is capable of generating a SHMOO plot.

The first delay element D1 delays the first strobe signal STRB1a, and outputs a first delayed strobe signal STRB1b.

The first clock recovery unit CDR1 makes a comparison between the phase of the first delayed strobe signal STRB1b and the phase of the clock signal SSCLK', and generates a first reference strobe signal STRB1c so as to perform phase adjustment such that the phase of the first delayed strobe signal STRB1b matches the phase of the clock signal SSCLK'. A predetermined delay time tpd1 occurs due to the path from the output of the clock signal SSCLK from the DUT 200 to the reception of the clock signal SSCLK via the input terminal of the first clock recovery unit CDR1. That is to say, the clock signal SSCLK' is delayed by the delay time tpd1 as compared with the clock signal SSCLK output from the DUT 200.

The first clock recovery unit CDR1 is configured as a PLL (Phase Locked Loop) circuit, a DLL (Delay Locked Loop) circuit, etc., using known techniques. For example, a clock recovery circuit employing a PLL circuit is disclosed in Patent document 3. Such a circuit can be suitably employed in the present invention.

The third delay element D3 delays the first reference strobe signal STRB1c, and outputs the signal thus delayed as the aforementioned first strobe signal STRB1a.

The first timing comparator TCP1 corresponds to the second timing comparator TCP2. The first comparator CP1 corresponds to the second comparator CP2. The first strobe adjustment unit 10 corresponds to the second strobe adjustment unit 12. The first clock recovery unit CDR1 corresponds to the second clock recovery unit CDR2. The first delay element D1 corresponds to the second delay element D2. The third delay element D3 corresponds to the fourth delay element D4. The mutually corresponding components have the same configuration and the same function.

The second comparator CP2 compares the clock signal SSCLK with the threshold voltage VOH/VOL, and outputs a judgment clock signal SSCLKa that corresponds to the level of the clock signal SSCLK.

The second timing comparator TCP2 latches the judgment clock signal SSCLKa at a timing that corresponds to each edge of the second strobe signal STRB2a. The second strobe adjustment unit 12 is configured as a variable delay circuit. The second strobe adjustment unit 12 applies a predetermined delay amount $\tau 2$ to the second strobe signal STRB2a, and outputs the second strobe signal STRB2a thus delayed to a clock terminal of the second timing comparator TCP2.

The second delay element D2 delays the second strobe signal STRB2a, and outputs the signal thus delayed as a second delayed strobe signal STRB2b.

The second clock recovery unit CDR2 makes a comparison between the phase of the second delayed strobe signal STRB2b and the phase of the clock signal SSCLK", and generates a second reference strobe signal STRB2c so as to perform phase adjustment such that the phase of the second delayed strobe signal STRB2b matches the phase of the clock signal SSCLK". A predetermined delay time tpd2 occurs due to the path from the output of the clock signal SSCLK from the DUT 200 to the reception of the clock signal SSCLK via the input terminal of the second clock recovery unit CDR2. That is to say, the clock signal SSCLK" is delayed by the delay time tpd2 as compared with the clock signal SSCLK output from the DUT 200.

The fourth delay element D4 delays the second reference strobe signal STRB2c, and outputs the signal thus delayed as the aforementioned second strobe signal STRB2a.

The signal processing units 20 and 20' have the same configuration. The signal processing unit 20 (20') includes a skew measurement unit 22 (22') and a judgment unit 24 (24').

In the calibration operation described later, the skew measurement units 22 and 22' respectively detect the timing at which the output DQb of the first timing comparator TCP1 transits and the timing at which the output SSCLKb of the second timing comparator TCP2 transits, while changing the respective delay amounts $\tau 1$ and $\tau 2$ set by the first strobe adjustment unit 10 and the second strobe adjustment unit 12. The skew measurement units 22 and 22' each measure the amount of skew that occurs in the data signal DQ or the source synchronous clock SSCLK based upon the timing difference thus detected. The skew amount $\theta$ of the clock signal SSCLK thus acquired in the calibration operation is stored in registers REG1 and REG2, or the like.

The judgment units 24 and 24' respectively compare the data signal DQb and the clock signal SSCLKb with expected values so as to judge the quality of the DUT 200.

The above is the configuration of the test apparatus 100. Next, description will be made regarding the operation thereof.

The test apparatus 100 performs two different kinds of operations, i.e., a calibration operation and a normal test operation in the respective stages. Description will be made below regarding these operations in order.

1. Calibration Operation
1.1 First Step

First, the first strobe adjustment unit 10 sets the delay amount to the transmission time tpd(i) that is required to transmit the data signal $DQ_0$ from the output terminal of the DUT 200 to the input terminal of the first timing comparator TCP1. In this step, the timing of the signal input to the first timing comparator TCP1 is virtually matched to the timing of the signal output from the DUT 200.

Furthermore, the delay amount to be applied by the first delay element D1 is set to the transmission time tpd1 that is required to transmit the clock signal SSCLK via a path from the output terminal of the DUT 200 to the input terminal of the first clock recovery unit CDR1.

In the same way, the second strobe adjustment unit 12 sets the delay amount to the transmission time tpd(ii) that is required to transmit the clock signal SSCLK via a path from the output terminal of the DUT 200 to the input terminal of the second timing comparator TCP2.

Furthermore, the delay amount to be applied by the second delay element D2 is set to the transmission time tpd2 that is required to transmit the clock signal SSCLK via a path from the output terminal of the DUT 200 to the input terminal of the second clock recovery unit CDR2.

1.2 Second step

In the state in which the delay amount to be applied by the second delay element D2 has been initialized, the skew measurement unit 22' measures the skew amount $\theta$ of the clock signal SSCLK. The skew amount $\theta$ thus measured is written to the memory REG1 and REG2. Furthermore, a delay amount that corresponds to the skew amount $\theta$ is set for the third delay element D3 and the fourth delay element D4.

The above-described calibration operation is carried out, thereby optimizing the timing of the test apparatus 100 has been optimized. Subsequently, a normal test operation (function test operation) is executed.

2. Normal Test Operation

Figure 2:
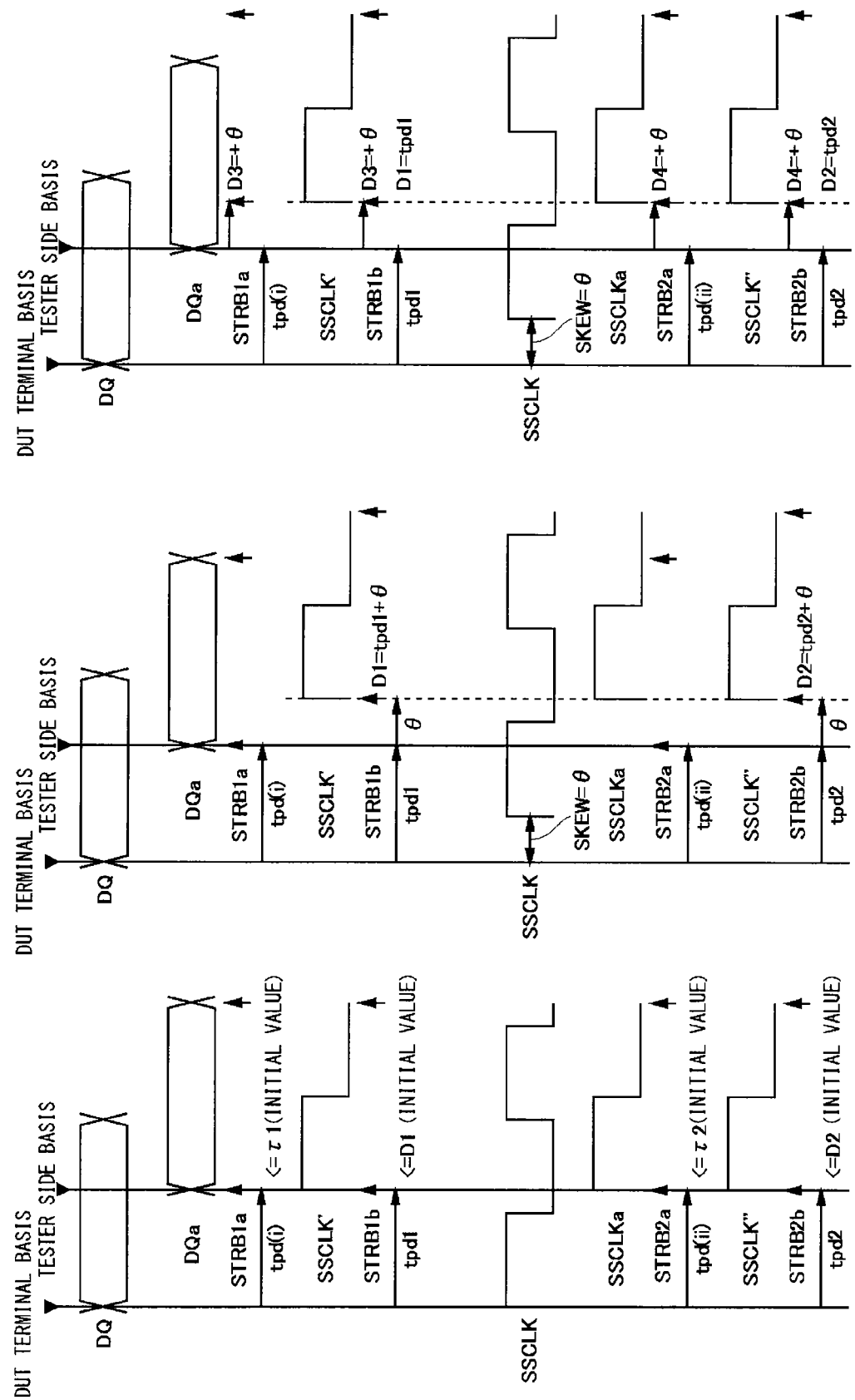
FIGS. 2A through 2C are time charts respectively showing a state of no skew, a state in which there is skew but skew calibration is not performed, and a state in which there is skew and skew calibration is performed.

After the calibration operation is completed, a normal test operation (function test operation) is executed. FIGS. 2A through 2C are time charts respectively showing the operations of the test apparatus 100 shown in FIG. 1 in an ideal state of no skew, a state in which there is skew but calibration is not performed, and a state in which there is skew and calibration is performed.

2.1. Ideal State

As shown in FIG. 2A, in a case in which there is no skew, the timing of the data signal DQ of the DUT 200 matches the timing of the edge of the source synchronous clock SSCLK at the output terminal (DUT terminal). In this case, these signals DQ and DQS are input to the test apparatus 100 with the same phase relation maintained between them. In the drawings, the signals in the first timing comparator TCP1 and the first clock recovery unit CDR1 are shown on the basis of the tester side.

In the ideal state, on the basis of the tester side, the timings of the data signal DQa, the source synchronous clock SSCLKa, and the strobe signals STRB1a and STRB2a match each other (in a case in which $\tau 1 = \tau 2 =$ initial value)

2.2. In a Case in which Skew Calibration is not Performed.

In an actual test operation for a DUT 200, in some cases, skew $\theta$ occurs between the source synchronous clock SSCLK and the data signal DQ at the DUT terminal. In this case, description will be made regarding an arrangement in which this skew is not calibrated (including a case in which the skew cannot be calibrated). In a case in which the calibration is not performed, there is a problem in that the strobe signals STRB1a and STRB2a cannot be set on the same basis as shown in FIG. 2B.

2.3. In a Case in which Skew Calibration is Performed.

FIG. 2C shows a time chart of a state in which the measured skew amount $\theta$ is merged with (added to) the delay amount of each of the third delay element D3 and the fourth delay element D4. FIG. 2C shows a state in which $\tau 1 = \tau 2 =$ the initial value. By performing the calibration, such an arrangement is capable of reproducing the phase relation between the data signal DQ and the source synchronous clock SSCLK at the DUT terminal of the DUT 200 in a sure manner on the basis of the tester side in the test apparatus 100. In this state, by appropriately setting the phase amounts τ1 and τ2, such an arrangement is capable of appropriately executing the normal function test operation.

Description has been made regarding the present invention with reference to the embodiment. The above-described embodiment has been described for exemplary purposes only, and is by no means intended to be interpreted restrictively. Rather, it can be readily conceived by those skilled in this art that various modifications may be made by making various combinations of the aforementioned components or processes, which are also encompassed in the technical scope of the present invention.

Figure 3:
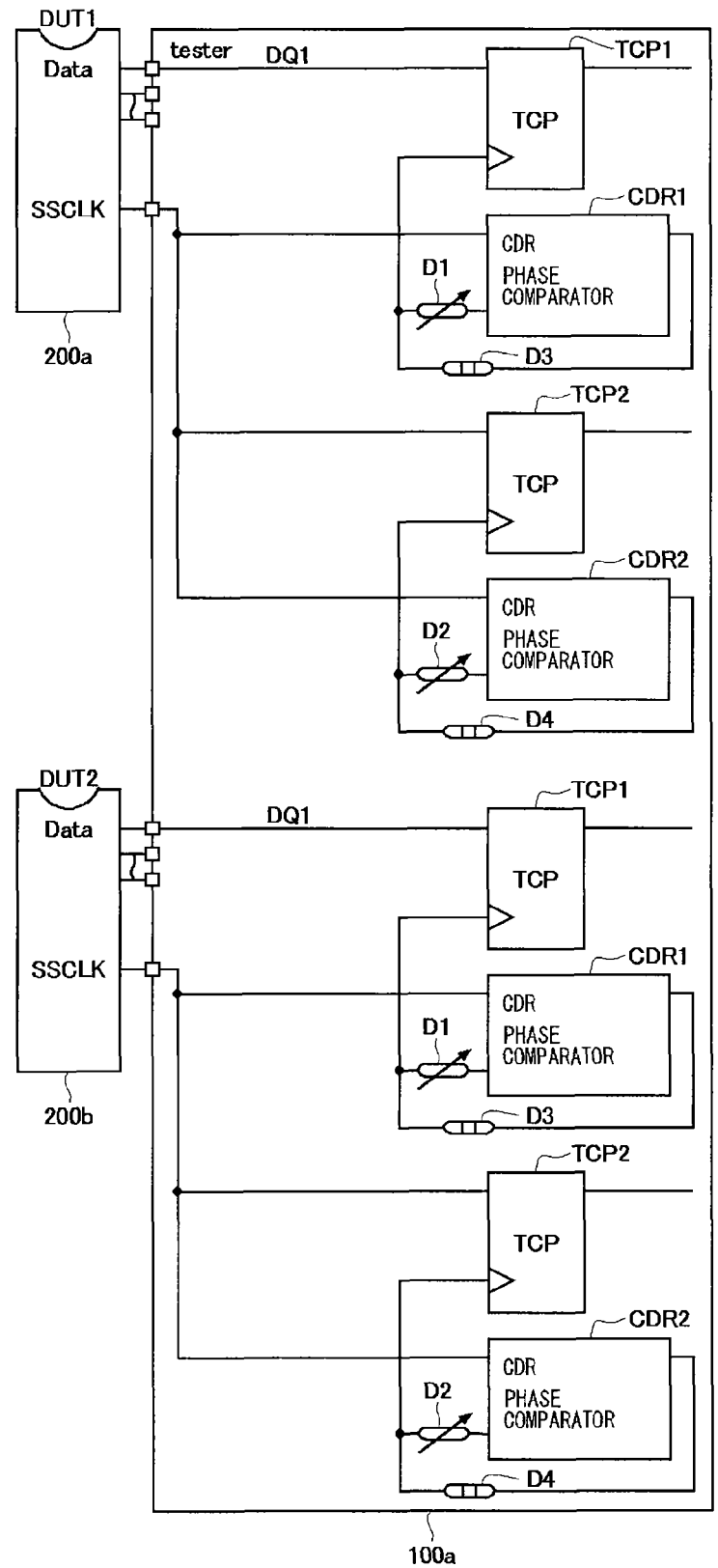
FIG. 3 is a circuit diagram which shows a configuration of a test apparatus according to a first modification.
Figure 4:
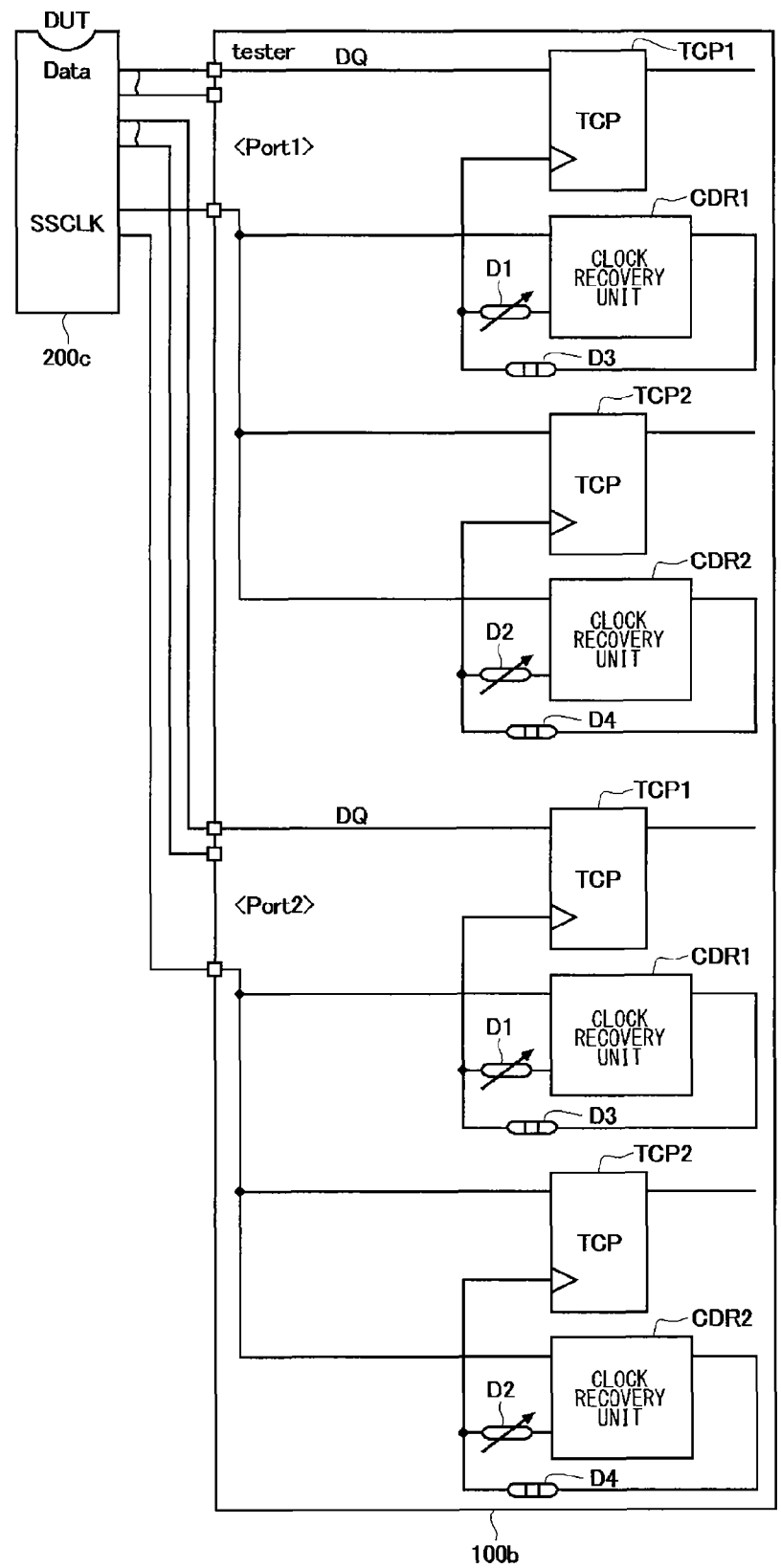
FIG. 4 is a circuit diagram which shows a configuration of a test apparatus according to a second modification.

FIG. 3 is a circuit diagram which shows a configuration of a test apparatus 100a according to a first modification. The test apparatus 100a has a function of measuring multiple devices under test 200a and 200b at the same time. The respective blocks configured to test the first DUT 200a and the second DUT 200b each have the same configuration as that of the test apparatus 100 shown in FIG. 1. In FIGS. 3 and 4, several components as shown in FIG. 1 are not shown. With such a modification, each test block is capable of reproducing the phase relation between the signals at the output terminal of the corresponding DUT 200.

FIG. 4 is a circuit diagram which shows a configuration of a test apparatus 100b according to a second modification. The test apparatus 100b shown in FIG. 4 is configured to test a so-called multi-port device. A DUT 200c is configured to perform data transmission in synchronization with multiple clock signals $SSCLK_1$ and $SSCLK_2$. The test apparatus 100b includes function blocks each having the same configuration as that shown in FIG. 1, in increments of clock signals SSCLK. With the test apparatus 100b shown in FIG. 4, such an arrangement allows the test apparatus 100b side to correct skew in increments of clock signals SSCLK, and to reproduce deviation of the data signals DQ on the common basis of the corresponding clock signal SSCLK.

Description has been made regarding the present invention with reference to the embodiments. However, the above-described embodiments show only the mechanisms and applications of the present invention for exemplary purposes only, and are by no means intended to be interpreted restrictively. Rather, various modifications and various changes in the layout can be made without departing from the spirit and scope of the present invention defined in appended claims.

The invention claimed is:

1. A test apparatus configured to test a data signal and a clock signal output from a device under test using a source synchronous method, the test apparatus comprising:
a first timing comparator configured to latch the data signal at a timing that corresponds to each edge of a first strobe signal;
a first delay element having its input terminal receiving the first strobe signal, and configured to delay the first strobe signal so as to output a first delayed strobe signal via its output terminal;
a first clock recovery unit having its first input terminal connected to the output terminal of the first delay element and its second input terminal receiving the clock signal, and configured to make a comparison between the phase of the first delayed strobe signal and the phase of the clock signal, to output a first reference strobe signal via its output terminal, and to adjust the phase of the first reference strobe signal such that the phases thus compared match each other;
a third delay element having its input terminal connected to the output terminal of the first clock recovery unit and its output terminal connected to a clock terminal of the first timing comparator, and configured to delay the first reference strobe signal, and to output the signal thus delayed as the first strobe signal via its output terminal;
a second timing comparator configured to latch the clock signal at a timing that corresponds to each edge of the second strobe signal;
a second delay element having its input terminal receiving the second strobe signal, and configured to delay the second strobe signal so as to output a second delayed strobe signal via its output terminal;
a second clock recovery unit having its first input terminal connected to the output terminal of the second delay element and its second input terminal receiving the clock signal, and configured to make a comparison between the phase of the second delayed strobe signal and the phase of the clock signal, to output a second reference strobe signal via its output terminal, and to adjust the phase of the second reference strobe signal such that the phases thus compared match each other; and
a fourth delay element having its input terminal connected to the output terminal of the second clock recovery unit and its output terminal connected to a clock terminal of the second timing comparator, and configured to delay the second reference strobe signal, and to output the signal thus delayed as the second strobe signal via its output terminal.

2. A test apparatus according to claim 1, further comprising a skew measurement unit configured to measure an amount of skew that occurs between the clock signal and the data signal, wherein the third and fourth delay elements respectively delay the first and second reference strobe signals by the amount of skew thus measured.

3. A test apparatus according to claim 2, wherein the delay amount to be applied by the first delay element is set to a transmission time that is required to transmit the clock signal via a path from an output terminal of the device under test to an input terminal of the first clock recovery unit,
and wherein the delay amount to be applied by the second delay element is set to a transmission time that is required to transmit the clock signal via a path from the output terminal of the device under test to an input terminal of the second clock recovery unit.

4. A test apparatus according to claim 1, wherein the delay amount to be applied by the first delay element is set to a transmission time that is required to transmit the clock signal via a path from an output terminal of the device under test to an input terminal of the first clock recovery unit,
and wherein the delay amount to be applied by the second delay element is set to a transmission time that is required to transmit the clock signal via a path from the output terminal of the device under test to an input terminal of the second clock recovery unit.

* * * * *